United States Patent [19]
Matsuda et al.

[11] Patent Number: 5,182,454
[45] Date of Patent: Jan. 26, 1993

[54] SCANNING ELECTRON MICROSCOPE

[75] Inventors: Hiroshi Matsuda, Kawagoe; Michitaka Suzuki, Akishima, both of Japan

[73] Assignees: JEOL Ltd.; JEOL Technics Co. Ltd., both of Tokyo, Japan

[21] Appl. No.: 844,250

[22] Filed: Mar. 2, 1992

[30] Foreign Application Priority Data

Mar. 5, 1991 [JP] Japan .................................. 38491

[51] Int. Cl.⁵ ............................................. H01J 37/28
[52] U.S. Cl. ..................................... 250/310; 250/397
[58] Field of Search ............... 250/310, 397, 306, 307; 324/158 R, 158 D, 642

[56] References Cited

U.S. PATENT DOCUMENTS

| | | | |
|---|---|---|---|
| 3,329,813 | 7/1967 | Hashimoto | 250/310 |
| 3,351,755 | 11/1967 | Hasler | 250/310 |
| 4,670,652 | 6/1987 | Ichihashi et al. | 250/310 |
| 4,751,384 | 6/1988 | Murakoshi et al. | 250/310 |
| 4,803,357 | 2/1989 | Brust | 250/310 |
| 5,001,344 | 3/1991 | Kato et al. | 250/310 |
| 5,097,204 | 3/1992 | Yoshizawa et al. | 250/310 |

Primary Examiner—Jack I. Berman
Assistant Examiner—Kiet T. Nguyen
Attorney, Agent, or Firm—Webb, Burden, Ziesenheim & Webb

[57] ABSTRACT

A scanning electron microscope capable of producing an accurate topographical image of a specimen surface irrespective of the elements of the specimen or if the dosage of electron beam varies. The instrument has two detectors arranged in such a way as to detect electron beams reflected from the specimen in two directions which are arranged symmetrically with respect to the normal line to the specimen surface. A subtractor circuit produces the difference between the output signals from the detectors. An adder circuit produces the sum of the output signals from the detectors. A corrective circuit divides the output signal from the subtractor circuit by the output signal from the adder circuit. The output signal from the corrective circuit is integrated by an integrator.

2 Claims, 5 Drawing Sheets

FIG. 3(f)   0.5
            0.4

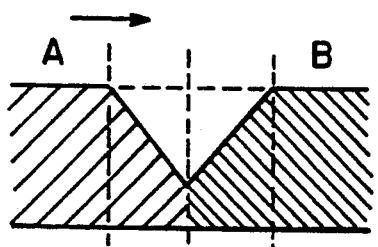
FIG. 6(a)
FIG. 6(b)
FIG. 6(c)
FIG. 6(d)
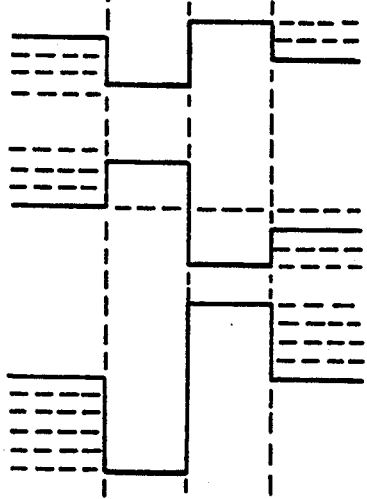
FIG. 6(e)
FIG. 6(f)  1.2
          1.0
FIG. 6(g)
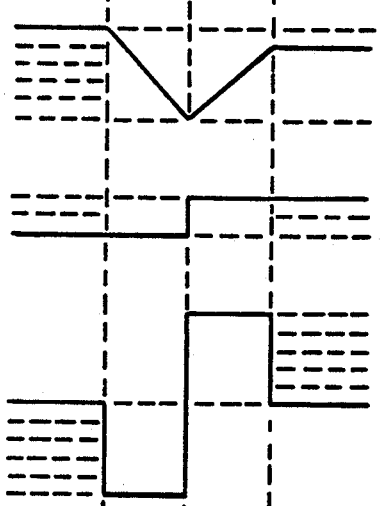
FIG. 6(h)
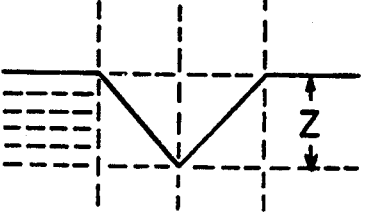

SCANNING ELECTRON MICROSCOPE

FIELD OF THE INVENTION

The present invention relates to a scanning electron microscope capable of obtaining a topographical image and a compositional image of the surface of a specimen without being affected by the elements constituting the specimen or by the incident electron beam dose.

BACKGROUND OF THE INVENTION

When a sharply focused electron beam is made to impinge on a specimen, reflected electrons and secondary electrons are emitted from the specimen. The intensities of these emitted electrons differ, depending on the topography of the specimen surface and also on the elements constituting the specimen. Accordingly, the reflected electron image can be separated into a topographical image and a compositional image of the specimen by using two detectors which are arranged symmetrically with respect to the optical axis to detect reflected electrons, for example. A topographical signal is derived from the difference between the output signals from the two detectors while the sum of the output signals is a signal representing the elements of the specimen. This technique is described in U.S. Pat. No. 3,329,813.

The generally accepted opinion is that the difference between the output signals from the detectors arranged symmetrically with respect to the optical axis depends only on the topography of the specimen surface. In practice, however, the intensity of released electrons varies among atomic numbers. Therefore, the difference signal does not accurately represent the topography.

It is customary to coat the specimen surface with a substance of a single atomic number, e.g., a single metal such as gold, prior to measurement to prevent the intensity of emitted electrons from being affected by the elements of the specimen. However, the amount of the coating substance deviates from the intended amount since the substance is an aggregation of particles. Especially at high magnifications, it is difficult to accurately image the topography of the specimen surface.

After a topographical signal is produced from reflection electron detectors, it is integrated by an integrator. In order to know the absolute value of the height of the output signal from the integrator, the conditions of the incident electron beam must be established. However, the amplitude of the output signal from each detector varies normally when the accelerating voltage of the electron beam is varied or when the bias voltage applied inside the electron gun is varied. Also, the amplitude changes with drift. Furthermore, the amplitude varies according to the setting of the saturation point of the filament. In addition, the amplitude is varied when the excitation current flowing through the condenser lens is changed. In these cases, the amplitude of the signal representing the intensity of reflected electrons varies and, therefore, it is impossible to accurately maintain the value obtained by the measurement. Hence, an accurate quantitative measurement cannot be made unless the signal intensity is corrected whenever the dosage of the incident electron beam is varied. For this reason, where a quantitative measurement of, for example, volume ratio taken in the direction of height or in three dimensions is needed, a change in the dose of the incident electron beam directly gives rise to an error.

SUMMARY OF THE INVENTION

It is an object of the present invention to provide a scanning electron microscope which scans the surface of a specimen with an electron beam, detects electron beams produced in directions substantially symmetrical with respect to the normal to the specimen surface with detectors disposed so as to detect these electron beams, determines the topography of the specimen surface from the output signals from the detectors, and is capable of making an accurate measurement if the intensity of the electrons emitted from the specimen varies among the elements constituting the specimen or if the dose of the incident electron beam is varied.

The present invention lies in a scanning electron microscope which scans the surface of the specimen with an electron beam, detects electron beams produced in directions substantially symmetrical with respect to the normal specimen surface with detectors disposed so as to detect these electron beams, and determines the topography of the specimen surface from the output signals from the detectors.

In one embodiment of the invention, the microscope further includes a subtractor circuit producing the difference between the output signals from the two detectors, an adder circuit for producing the sum of the output signals from the detectors, a corrective circuit that divides the output signal from the subtractor circuit by the output signal from the adder circuit to correct the former signal, and an integrator circuit for integrating the output signal from the correcting circuit.

In another embodiment of the invention, the microscope further includes a subtractor circuit producing the difference between the output signals from the two detectors, a current detector for detecting the current absorbed by the specimen, a corrective circuit for multiplying the output signal from the subtractor circuit by the output value from the current detector to correct the former output signal, and an integrator circuit for integrating the output signal from the correcting circuit.

In a further embodiment of the invention, the microscope further includes a subtractor circuit for producing the difference between the output signals from the two detectors, an adder circuit for producing the sum of the output signals from the detectors, a correcting circuit for dividing the output signal from the subtractor circuit and the output signal from the adder circuit by the amount of change in the dose of the incident electron beam, and an integrator circuit for integrating the output signal from the corrective circuit.

In accordance with the present invention, an electron beam is directed to the surface of a specimen, and electron beams are emitted from the specimen in directions that are symmetrical with respect to the normal to the specimen surface. These electron beams are detected. The difference between the output signals from the detectors is produced. This difference signal is divided by the sum of the output signals from the detectors, or the difference signal is multiplied by the value of the electrical current absorbed by the specimen. Thus, the difference signal is corrected. As a result, the effects of the elements constituting the specimen are removed. The signal corrected by the division is integrated to quantitatively measure the topography of the specimen surface accurately. Also, the difference between the output signals from the detectors or the sum of these output signals is divided by the amount of change in the dose of the incident electron beam to make a correction. In this way, the effects of changes in the dosage of the impinging electron beam are eliminated. Under this condition, a topographical image of the specimen and a compositional image can be obtained. Also, the distribution of the elements of the specimen can be measured.

Other objects and features of the invention will appear in the course of the description thereof which follows.

BRIEF DESCRIPTION OF THE DRAWINGS

FIGS. 3(a) to FIG. 3(h) are waveform diagrams of signals produced at various locations in the microscope shown in FIG. 1;

FIGS. 6(a) to FIG. 6(h) are waveform diagrams of signals produced at various locations in the microscope shown in FIG. 4;

DETAILED DESCRIPTION OF THE INVENTION

Figure 1:
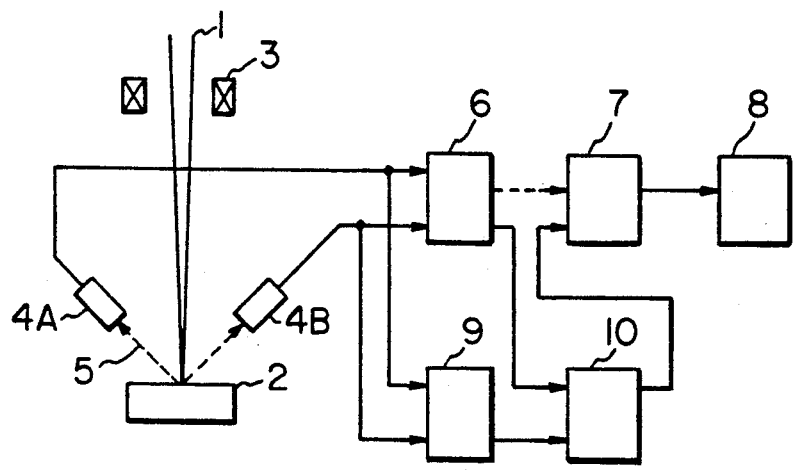
FIG. 1 is a schematic block diagram of a scanning electron microscope according to the invention.

Referring to FIG. 1, there is shown a scanning electron microscope embodying the concept of the present invention. This microscope has an electron gun (not shown) emitting an electron beam 1 which is sharply focused onto the surface of a specimen 2 by electron lenses (not shown). The electron beam is scanned across the surface of the specimen in two dimensions by deflectors 3. Electron beams 5 reflected from the specimen are detected by detectors 4A and 4B which are arranged substantially symmetrically with respect to the normal line to the specimen surface. A subtractor circuit 6 produces the difference between the output signals from the detectors 4A and 4B. An adder circuit 9 produces the sum of the output signals from the detectors 4A and 4B. A corrective circuit 10 divides the output signal from the subtractor circuit 6 by the output signal from the adder circuit 9 to produce a corrected signal. This corrected signal is integrated by an integrator circuit 7. The output signal from the integrator circuit 7 is sent to a display unit 8 where the integrated signal is made visible.

Figure 2:
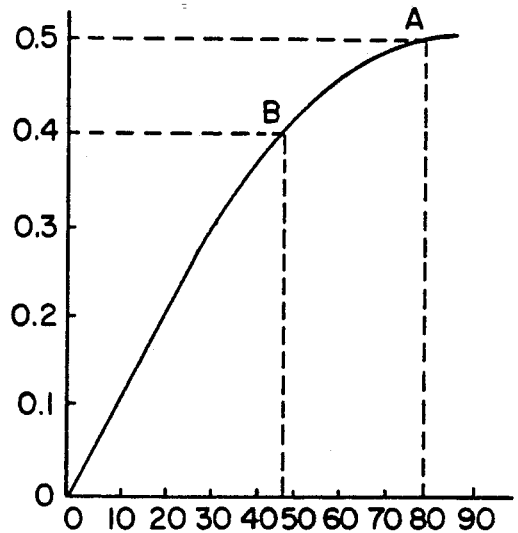
FIG. 2 is a graph showing the relation of the reflection electron coefficient to atomic number.
Figures 3A, 3B, 3C, 3D, 3E, 3G, 3H:
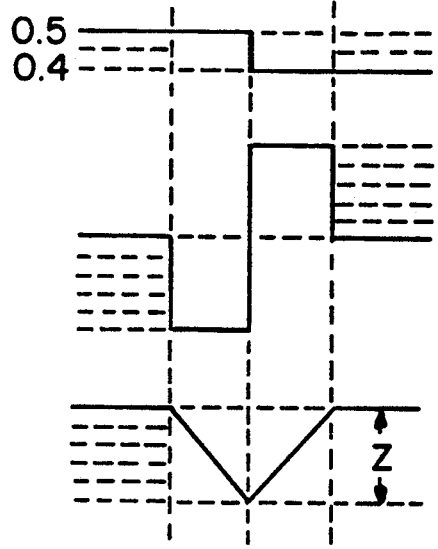
Figure 5:
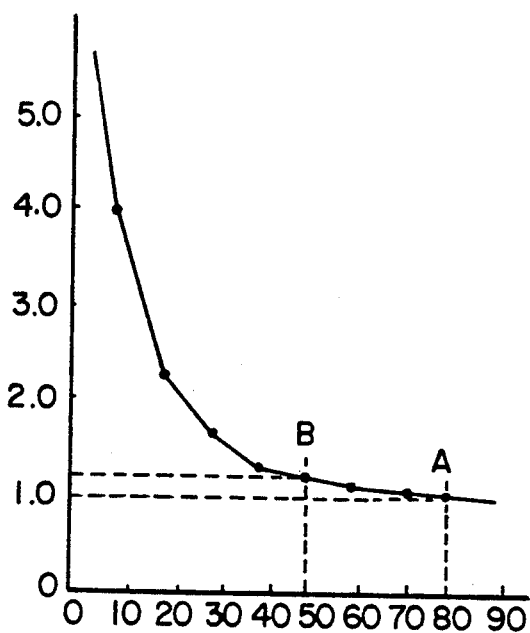
FIG. 5 is a graph showing the relation of the absorption current coefficient to atomic number.

It is now assumed that a V-shaped groove as shown in FIG. 3(a) exists in the surface of the specimen, the groove having a cross section that is symmetrical laterally. It is also assumed that one portion of the specimen located on one side of the central line of this cross section consists of element A and that the other portion located on the other side consists of element B. That is, the specimen is composed of dissimilar elements. As indicated in FIG. 2, the elements A and B have reflection electron coefficients of 0.5 and 0.4, respectively. The detectors 4A and 4B are arranged symmetrically with respect to the central line of the V-shaped groove. The detector 4A is located on the side of the element A, while the detector 4B is positioned on the side of the element B. The electron beam is scanned in the direction indicated by the arrow. Electrons reflected from the specimen are detected by the detectors 4A and 4B.

The reflection coefficient of the element B is 80% of the reflection coefficient of the element A. Where electrons reflected from a flat surface are detected, the amplitude of the output signal from the detector 4A is lower by about 20% on the side of the element B than on the side of the element A, as shown in FIG. 3(b). Where electrons reflected from an inclined surface are detected, the change in the amplitude of the output signal from the detector 4A is smaller by about 20% on the side of the element B than on the side of the element A. It is to be noted that the amplitude of the output signal from the detector is decreasing over the inclined surface on the side of the element A, whereas the amplitude is increasing on the side of the element B. The output signal from the detector 4B is similar to the output signal from the detector 4A except that their amplitudes change in opposite directions over the inclined surface as shown in FIG. 3(c).

The subtractor circuit 6 produces the difference between the output signals from the detectors. That is, the waveform shown in FIG. 3(c) is subtracted from the waveform shown in FIG. 3(b). As a result, an output shown in FIG. 3(d) is produced. This output signal depends on the elements and also on the topography. This output signal from the subtractor circuit 6 is directly applied to the integrator circuit 7 as indicated by the broken line in FIG. 1. The integrator circuit 7 simply integrates its input waveform. The output waveform from the integrator circuit 7 is shown in FIG. 3(e) and consists of left and right portions on opposite sides of the boundary line between the dissimilar elements. These two portions have different amplitudes and are not symmetrical with respect to the boundary line. Hence, the output waveform is not identical to the cross-sectional shape of FIG. 3(a).

The adder circuit 9 produces the sum of the output signals from the detectors. That is, the waveform shown in FIG. 3(b) and the waveform shown in FIG. 3(c) are superimposed. The waveform of the sum signal from the adder circuit 9 is shown in FIG. 3(f). This sum signal depends only on the elements. The output signal from the adder circuit 9 and the output signal from the subtractor circuit 6 are both supplied to the corrective circuit 10. In order to compensate for the difference of the reflection electron coefficient between the elements A and B, the corrective circuit 10 divides the output signal from the subtractor circuit 6 by the output signal from the adder circuit 9, based on the output level obtained from the element A, i.e., the signal intensity representing the signal B is divided by 0.8, since the reflection coefficient of the element B is 80% of the reflection coefficient of the element A as described above. The waveform of the output signal from the corrective circuit 10 is shown in FIG. 3(g) and consists of two symmetrical portions which are identical in amplitude but differ in polarity. This output signal from the corrective circuit 10 is integrated by the integrator circuit 7 so that the effects of the different elements are completely removed. As shown in FIG. 3(h), this output signal from the integrator circuit 7 consists of two symmetrical portions which coincide with the topography of the specimen surface. This signal is displayed on the display unit 8 to obtain a topographic image. Also, the height z of the specimen can be accurately measured as shown in FIG. 3(h).

The graph showing the relation of the reflection electron coefficient to atomic number can be corrected for all the elements by calibrating the graph against the two known elements A and B. The correction can be made by a simple division operation for specimens consisting of ordinary elements. However, in the case of a specimen whose properties are not determined by its constituting elements, it is necessary to actually measure the properties. Then, the graph is partially, stepwise, continuously, or otherwise corrected.

Figure 4:
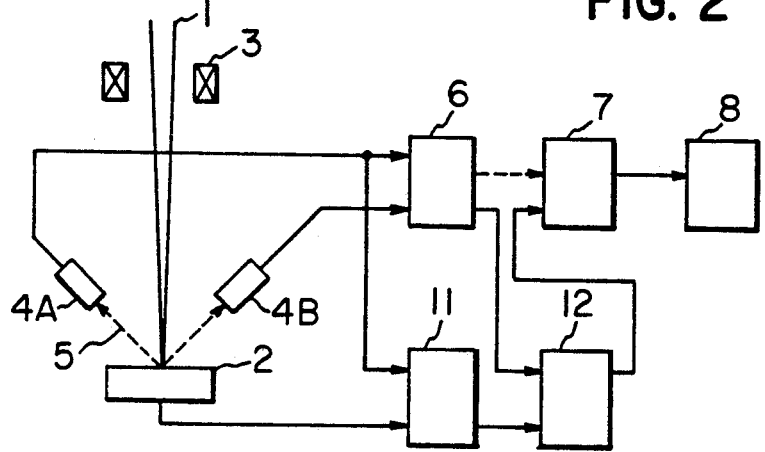
FIG. 4 is a schematic block diagram of another scanning electron microscope according to the invention.

Referring next to FIG. 4, there is shown another scanning electron microscope according to the invention. This instrument is similar to the instrument shown in FIG. 1 except that the adder circuit 9 and the corrective circuit 10 are replaced by an absorption current detector 11 and a corrective circuit 12 that makes a correction by a multiplication operation.

As shown in FIG. 6(a), the specimen surface is identical in composition and profile to the specimen surface shown in FIG. 3(a). It is assumed that the ratio of the absorption current coefficient of the element A to that of the element B is 1.0:1.2. Thus, the ratio of the amount of the electrons reflected from the element A to the amount of the electrons reflected from the element B is 0.5:0.4. The output signals from the detectors 4A and 4B take the forms shown in FIGS. 6(b) and 6(c), respectively, similarly to FIGS. 3(b) and 3(c). The subtractor circuit 6 produces an output signal shown in FIG. 6(d). This output signal depends on the elements and also on the topography. This output signal is directly integrated by the integrator circuit 7. The waveform of the output signal from the integrator circuit 7 is shown in FIG. 6(e) and consists of two portions which are not symmetrical with respect to the boundary between the dissimilar elements and differ in amplitude. This waveform is not coincident with the cross-sectional shape shown in FIG. 6(a).

Since the output signal from the absorption current detector 11 is roughly proportional to the inverse of the reflection electron coefficient, an output which depends only on the elements as shown in FIG. 6(f) can be obtained. In the present embodiment, the output signal from the current detector 11 is fed to the corrective circuit 12, which produces the product of the output from the subtractor circuit 6 and the output from the current detector 11 while the output signal obtained from the element A is normalized at 1 in order to compensate for the difference in absorption current coefficient between the elements A and B. That is, the output signal obtained from the element B is multiplied by 1.2. In this way, the amplitude is corrected for atomic number. The waveform of the output signal from the corrective circuit 12 is shown in FIG. 6(g) and consists of two symmetrical portions which differ in polarity but are identical in amplitude. The output signal from the corrective circuit 12 is integrated by the integrator circuit 7. As a result, the effects of the dissimilar elements are completely eliminated. As shown in FIG. 6(h), the output waveform of the integrator circuit 7 consists of two symmetrical portions conforming to the topography of the specimen surface.

Figure 7:
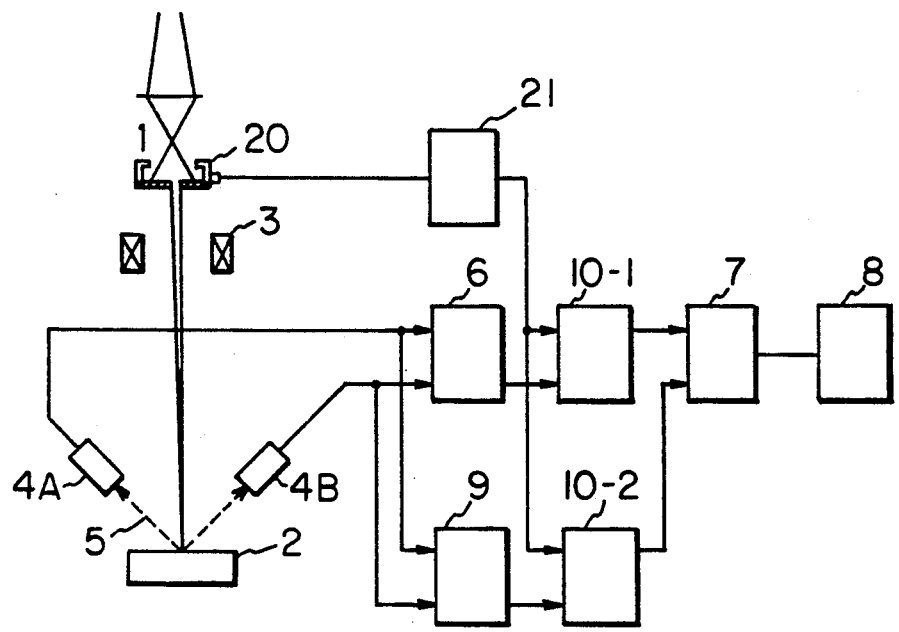

Referring next to FIG. 7, there is shown a further scanning electron microscope according to the invention. This instrument is adapted to investigate a specimen which consists of only one element but is similar in surface topography to the specimen described in connection with FIGS. 1-3. This instrument is similar to the instrument in FIG. 1 except that the corrective circuit 10 consists of two corrective circuits 10-1 and 10-2 utilizing division and that a detector 20 and a current amplifier 21 are added. The detector 20 detects the amount of change in the incident electron beam dosage.

Figure 9A:
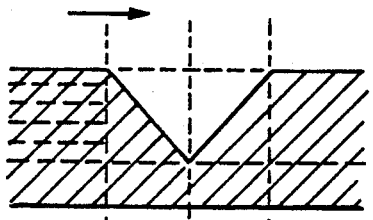
FIGS. 9(a) to FIG. 9(e) are waveform diagrams of signals produced at various locations in the microscopes shown in FIGS. 7 and 8.
Figure 9B:
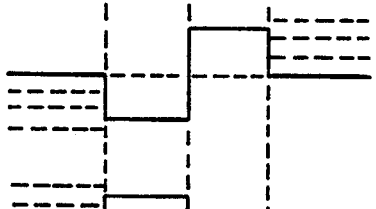
Figure 9C:
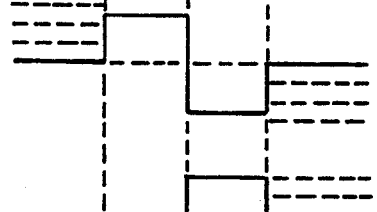
Figure 9D:
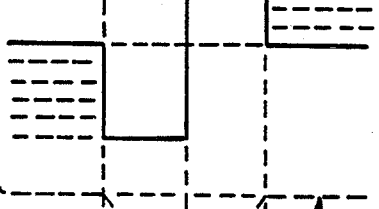
Figure 9E:
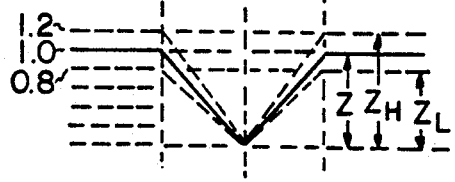

The electron beam 1 emitted by the electron gun is focused by the electron lenses and made to impinge on the detector 20. This detector 20 is mounted above the objective aperture or acts also as the objective aperture. The beam passes through the aperture and is focused more sharply by the objective lens. The beam is scanned on the specimen surface by the deflectors 3. Electron beams 5 reflected from the specimen are detected by the reflection electron detectors 4A and 4B which are arranged symmetrically with respect to the normal line to the specimen surface. In this case, those components of the output signals from the detectors 4A and 4B which are related to the surface topography of the specimen are opposite in polarity and, therefore, the output signals vary as shown in FIG. 9(b) and FIG. 9(c), respectively. These output signals are supplied to the subtractor circuit 6 which produces the difference between them. As shown in FIG. 9(d), the output signal from the subtractor circuit 6 depends on only the topography of the specimen surface. The output signal from the subtractor circuit 6 is directly sent to the integrator circuit 7. The waveform of the output signal from the integrator circuit 7 is shown in FIG. 9(e) and analogous to the cross-sectional shape of the specimen surface. The height z can be measured by previously calibrating this output waveform with a reference specimen.

However, if the dose of the electron beam impinging on the specimen varies, then the measured height z of the specimen changes to $Z_H$ or $Z_L$ as indicated by the dot-and-dash lines in FIG. 9(e). Therefore, this measured value is not accurate. Accordingly, the change in the dose of the incident electron beam is detected by the electron beam dose change amount detector 20. The output signal from this detector is amplified to an appropriate value by the current amplifier 21. The output signal from the subtractor circuit 6 is corrected in response to the output signal from the amplifier 21 by the corrective circuit 10-1 up to the ratio of the measured height $Z_H$ or $Z_L$ to a reference output Z. In the illustrated example, the ratio is $Z_H/Z = 1.2/1$ or $Z_L/Z = 0.8/1 = 0.8$. In this way, it is possible to compensate for the variation. The compensated signal is displayed on the display unit 8. Consequently, a topographical image of the specimen surface free from the effects of changes in the dose of the incident electron beam can be obtained. As indicated by the solid line in FIG. 9(e), the height z can be accurately measured.

The adder circuit 9 produces the sum of the output signals from the detectors 4A and 4B. The output signal from the adder circuit 9 is similarly corrected up to the ratio of the measured height $Z_H$ or $Z_L$ to the reference output Z by the corrective circuit 10-2. In this manner, the amplitude of the output signal is always corrected. In consequence, an accurate compositional image can be presented.

Figure 8:
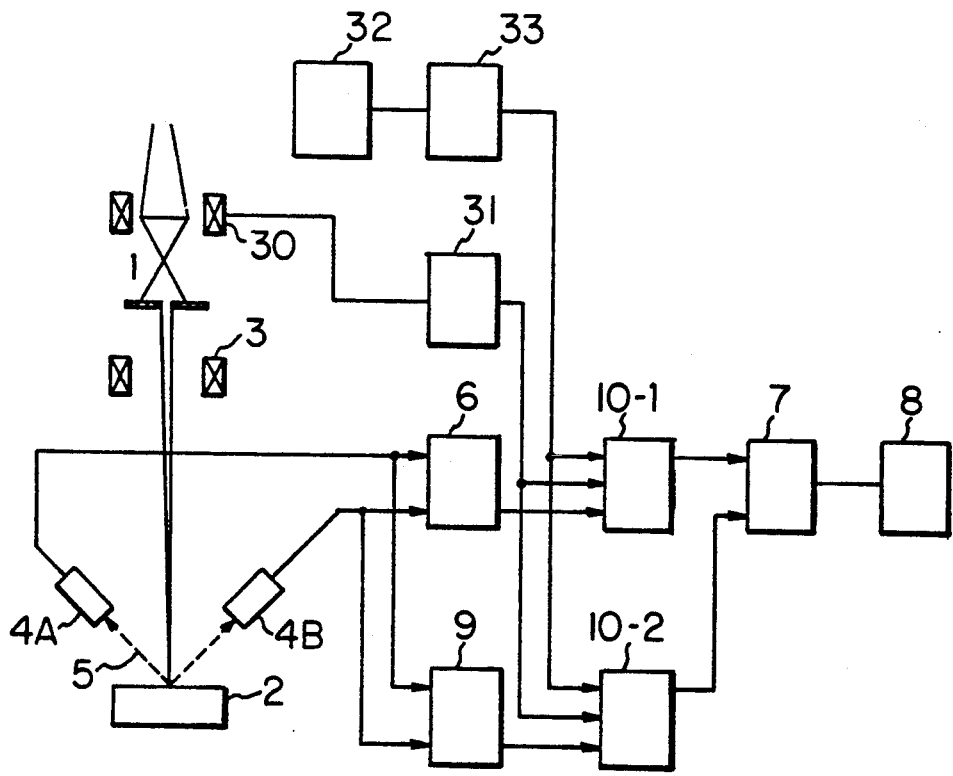
FIGS. 7 and 8 are schematic block diagrams of further scanning electron microscopes according to the invention.

Changes in the dosage of the electron beam impinging on the specimen are primarily caused by changes in the accelerating voltage of the electron gun, changes in the bias voltage, and changes in the strengths of the focusing electron lenses. Therefore, in the embodiment shown in FIG. 8, a high-voltage circuit 32 which causes the electron gun to emit an electron beam produces a signal changing in response to the amount of the incident electron beam. This signal is detected by a current detector 33. A control circuit 31 which controls focusing electron lenses 30 produces a control voltage corresponding to the change in the amount of the incident electron beam. A first corrective circuit 10-1 divides the output signal from the subtractor circuit 6 by one of the output signals from the control circuit 31 and from the current detector 33. In this division operation, the reference output indicated by the solid line in FIG. 9(e) is normalized at 1. In this way, the changes indicated by the dot-and-dash lines are corrected. As a result, the height Z indicated by the solid line in FIG. 9(e) is accurately measured.

The output signal from the adder circuit 9 can be similarly corrected. In this manner, an output signal which is always corrected can be obtained. An accurate compositional image can be derived. Also, the distribution of the constituting elements can be determined from the reflection electron coefficient curve of FIG. 2 as an average atomic number and displayed.

In the above embodiments, the electron beam is scanned in one dimension on the specimen surface. The resulting electrons are detected by a pair of detectors. Plural pairs of detectors may also be disposed. In this case, the detectors are oriented in four directions substantially symmetrically with respect to the normal to the specimen surface. The electron beam is scanned in two dimensions. The accepted image signal is stored in a frame memory or the like. The stored image signal is corrected for dissimilar elements laterally and vertically in the same way as in the above embodiments. The output signals from the detectors are corrected by dividers and then integrated by an integrator circuit. Using the output signal from the integrator circuit, the surface roughness can be measured, as well as the height of the specimen. Various signals, taking analog or digital form, are processed so that the cross-sectional shape of the specimen may be displayed whenever a scan is made along a line. In addition to measurements, a three-dimensional image analysis can be made by measuring the volume ratio, contour lines, and unevenness such as ridges and recesses. In the above embodiments, the detectors act to detect reflected electrons. It is also possible to provide plural pairs of detectors detecting secondary electrons. Also in this case, the output signals from the detectors are similarly corrected, taking account of the constituting elements, the efficiency at which electrons are produced, and actually measured values of the properties.

As described thus far, in accordance with the present invention, it is not necessary to coat the specimen surface with a single metal. The effects of the roughness of the specimen surface caused by coating can be re-moved. Therefore, an accurate topographical image can be obtained. Also, an accurate quantitative measurement can be made in principle. Furthermore, it is not necessary to maintain constant the dose of the incident electron beam impinging on the specimen surface. Repeated correction of intensity which is cumbersome to perform can be dispensed with. In principle, the topography of a wider region of a specimen surface can be imaged accurately. Also, an accurate quantitative measurement can be made over a wider region.

Having thus described our invention with the detail and particularity required by the Patent Laws, what is desired and claimed to be protected by Letters Patent is set forth in the following claims.

What is claimed is:

1. A scanning electron microscope comprising:
    an electron gun emitting an electron beam to the surface of a specimen;
    a means for scanning the electron beam on the specimen surface;
    two detectors arranged in such a way as to detect electron beams produced in two directions which are substantially symmetrical with respect to the normal line to the specimen surface;
    a subtractor circuit producing the difference between the output signals from the detectors;
    a current detector detecting the electrical current absorbed by the specimen;
    a corrective circuit which multiplies the output signal from the subtractor circuit by the output value from the current detector to correct the output signal from the subtractor circuit; and
    an integrator circuit which integrates the output signal from the corrective circuit.

2. A scanning electron microscope comprising:
    an electron gun emitting an electron beam to the surface of a specimen;
    a means for scanning the electron beam on the specimen surface;
    two detectors arranged in such a way as to detect electron beams produced in two directions which are substantially symmetrical with respect to the normal line to the specimen surface;
    a subtractor circuit producing the difference between the output signals from the detectors;
    a means for detecting the amount of change in the incident electron beam;
    a corrective circuit which divides the output signal from the subtractor circuit by the amount of change in the incident electron beam; and
    an integrator circuit which integrates the output signal from the corrective circuit.

* * * * *